United States Patent

Sato et al.

[11] Patent Number: 5,861,601
[45] Date of Patent: Jan. 19, 1999

[54] MICROWAVE PLASMA PROCESSING APPARATUS AND METHOD

[75] Inventors: Yoshiaki Sato, Tokuyama; Mitsuru Katamoto; Hironobu Kawahara, both of Kudamatsu; Minoru Soraoka, Yamaguchi-Ken; Tsuyoshi Umemoto, Hikari; Hideki Kihara, Kudamatsu; Katsuyoshi Kudo, Kudamatsu; Tooru Yukimasa, Kudamatsu; Hirofumi Kakutani, Kudamatsu, all of Japan

[73] Assignee: Hitachi, Ltd., Tokyo, Japan

[21] Appl. No.: 340,337

[22] Filed: Nov. 14, 1994

[30] Foreign Application Priority Data

Nov. 12, 1993 [JP] Japan .................................. 5-283028

[51] Int. Cl.⁶ .................................................. B23K 10/00
[52] U.S. Cl. .............................. 219/121.43; 219/121.41; 204/298.37; 156/345
[58] Field of Search ........................ 219/121.43, 121.44, 219/121.59, 121.41, 121.36; 204/298.17, 298.18, 298.35, 298.37; 156/345

[56] References Cited

U.S. PATENT DOCUMENTS

| 4,491,496 | 1/1985 | Laporte et al. ............................ 156/345 |
| 5,215,619 | 6/1993 | Cheng et al. ............................. 156/345 |
| 5,308,950 | 5/1994 | Ramm et al. ......................... 219/121.43 |
| 5,356,478 | 10/1994 | Chen et al. ................................. 134/1 |
| 5,387,777 | 2/1995 | Bennett et al. ...................... 219/121.43 |
| 5,410,122 | 4/1995 | Su et al. .............................. 219/121.44 |
| 5,454,903 | 10/1995 | Redeker et al. ........................... 216/67 |
| 5,507,874 | 4/1996 | Su et al. . |

FOREIGN PATENT DOCUMENTS 63-76434  4/1988  Japan .
2-86127   3/1990  Japan .

OTHER PUBLICATIONS

Declaration executed by Motoo Nagahashi.
English Translation of Japanese Patent Appln. No. 283028, filed Nov. 12, 1993.

*Primary Examiner*—Mark H. Paschall
*Attorney, Agent, or Firm*—Antonelli, Terry, Stout & Kraus, LLP

[57] ABSTRACT

The present invention relates to a microwave plasma processing apparatus, suited for generating a plasma by using microwaves, and a processing method. Microwaves propagated through a circular waveguide are tuned in the space thereof by a microwave tuner that is installed to match the impedance, and are introduced in a uniform and most efficient state into a discharge block having a plasma-resistant inner surface that is enlarged in a tapered form through a microwave introduction window. Then, a processing gas controlled to a predetermined pressure by a gas supplying structure and gas evacuating structure is turned into a plasma which is more uniform and is more dense by interaction of a microwave electric field that is efficiently introduced and a magnetic field produced by a solenoid coil.

2 Claims, 3 Drawing Sheets

MICROWAVE PLASMA PROCESSING APPARATUS AND METHOD

BACKGROUND OF THE INVENTION

1. Field of Invention

The present invention relates to a microwave plasma processing apparatus and a processing method. More particularly, it relates to a microwave plasma processing apparatus and a processing method which are well suited for generating a plasma by use of microwaves and subjecting samples such as semiconductor device substrates, etc. to a plasma processing such as an etching process, a film forming process, etc.

2. Description of the Prior Art

As a conventional microwave plasma processing apparatus, the one disclosed in, for example, Japanese Patent Laid-Open No. 133322/1992 is known. The apparatus is such that the waveguide has a nearly cylindrical shape, a discharge chamber connected to the waveguide via a gas-tight microwave transmission window is formed into a discharge block made of a hollow cylindrical electrically conductive material that is enlarged in a taper in the direction in which the microwaves travel, and a plasma of a high density is generated by the interaction of a magnetic field generated in a discharge chamber by an air-core coil provided on the outside of the discharge block and a microwave electric field introduced into the discharge chamber via the waveguide, in order to enhance uniformity of the processing.

The above-mentioned prior art, however, does not pay attention to the mode of the microwaves introduced into the discharge chamber, the plasma resistance of the inner wall of the discharge chamber, and change in the process characteristics during continuous processing. That is, attention has not been paid sufficiently to introduction the lines of electric force of microwaves propagated through the waveguide into the discharge chamber of and, besides, the uniformity of plasma and the plasma generation efficiency are not satisfactory. According to the prior art, furthermore, the discharge block is made of a nonmagnetic electrically conductive material such as aluminum. When the material to be processed is of Al or an Al alloy, a halogen gas is used as the etching gas. When such a gas is turned into a plasma, not only the material to be processed but also the inner wall surfaces of the discharge block constituting the discharge chamber are etched by active species in the plasma. Besides, the processing changes with time due to a rise in the temperature of the discharge block of the plasma generation chamber during the processing with plasma and due to the adhesion of reaction products generated during the processing with the plasma.

SUMMARY OF THE INVENTION

An object of the present invention is to provide a microwave plasma processing apparatus wherein the microwave mode introduced into the discharge chamber can be optimized and a uniform plasma of a high density can be produced.

Another object of the present invention is to provide a microwave plasma processing apparatus by use of which even a material that uses a halogen gas can be processed with plasma without permitting the discharge block to be etched.

A further object of the present invention is to provide a microwave plasma processing apparatus and a processing method capable of stably executing the processing with a plasma maintaining a good state without any change in the processing performance with the passage of time even when a material to be processed is continuously processed.

The above-mentioned object is accomplished by a microwave plasma processing apparatus comprising:

- a sample stage on which is placed a substrate to be processed;
- a processing chamber which contains therein the sample stage and has an opening facing the surface of the sample stage on which is placed the substrate to be processed;
- a discharge block of a hollow cylinder made of a nonmagnetic electrically conductive material that is mounted on the outside of the opening of the processing chamber, and having an inner surface that is tapered to enlarge toward the sample stage;
- a circular waveguide that is connected, via a microwave introduction window, to an opening at the other end of the discharge block;
- a tuning means which is provided in the circular waveguide to tune the microwaves;
- a solenoid coil provided on the outside of said discharge block;
- a gas feeding means for feeding a processing gas into the discharge block; and
- an evacuation means for evacuating the interior of the processing chamber to a predetermined pressure.

The above-mentioned another object is accomplished by forming a plasma-resistant protective member on the inner wall surface of the discharge block.

The above-mentioned further object is accomplished by providing the discharge block with a heater of which the temperature can be adjusted and by employing a method wherein:

- a substrate to be processed is processed with a plasma while keeping a plasma generation chamber at a predetermined constant temperature;
- after the substrate to be processed is processed with a plasma and is transferred from the processing chamber, the interior of the processing chamber is cleaned with a plasma without placing any substrate to be processed on the sample stage;
- a new substrate to be processed is transferred into the processing chamber after the cleaning with a plasma has been finished; and
- the new substrate to be processed is then processed.

The operation of the invention will be described below.

Microwaves propagated through the circular waveguide are tuned in the space thereof by a tuning means the shape of which is set optimally for the impedance matching, introduced in a uniform and most efficient state into the discharge block through a microwave introduction window, and a processing gas controlled to a predetermined pressure by a gas feeding means and an evacuating means is turned into a plasma uniformly at a high density by the interaction of a microwave electric field that is efficiently introduced and a magnetic field produced by a solenoid coil. This makes it possible to further improve the processing performance.

By the provision of a protective member formed on the inner wall surface of the discharge block, furthermore, the discharge block is not etched even when a material to be processed of the same material of the discharge block is processed with a plasma generated in the discharge block. Therefore, the processing with a plasma is carried out with a good processing performance independently of the material that is to be processed.

Moreover, by providing the discharge block with a heater of which the temperature can be adjusted and by employing a method wherein a substrate to be processed is processed with a plasma while keeping a plasma generation chamber at a predetermined constant temperature; after the substrate to be processed is processed with a plasma and is transferred from the processing chamber, the interior of the processing chamber is cleaned with a plasma without placing any substrate to be processed on a sample stage; a new substrate to be processed is introduced into the processing chamber after the cleaning with a plasma has been finished; and the new substrate to be processed is then processed, the processing chamber can be kept clean and stable plasma processing can be continuously performed.

DESCRIPTION OF THE EMBODIMENTS

An embodiment of the present invention will now be described with reference to FIG. 1.

Figure 1:
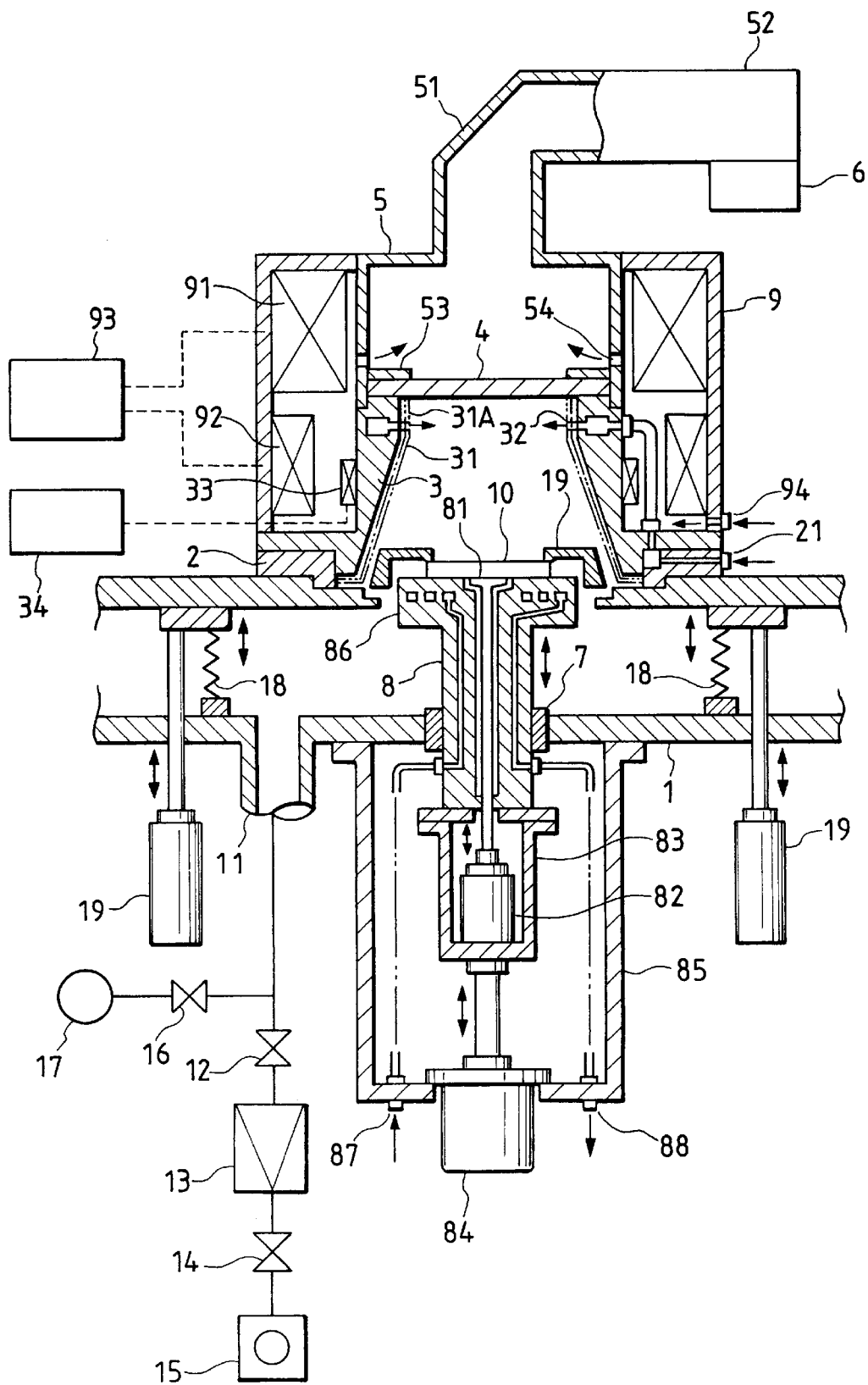
FIG. 1 is a vertical sectional view illustrating a microwave plasma processing apparatus of an embodiment of the present invention.

FIG. 1 is a diagram illustrating the structure of a microwave plasma processing apparatus. This is the case where the apparatus is used for etching which is a processing with a plasma.

In FIG. 1, a processing chamber 1 is a container made of, for example, stainless steel and has a space therein. The processing chamber 1 has a circular opening in an upper portion thereof and an exhaust port 11 formed in a lower portion thereof. An evacuation means is connected to the exhaust port 11. The evacuation means in this case comprises a pressure control valve 12, a turbo molecular pump 13, a hot valve 14 and a rotary pump 15, which are connected to the exhaust port 11 in the order mentioned via a piping. A pressure detector 17 (Penning gage in this case) for detecting a high degree of vacuum is attached, via a valve 16, to the exhaust port 11 before the pressure control valve 12. Moreover, a diaphragm vacuum gage (not shown) for detecting the pressure during the processing is attached to the exhaust port 11 before the pressure control valve 12. The internal space of the processing chamber 1 is partitioned by sluice valves 18 made up of bellows. To the sluice valves 18 are coupled lift drive units 19.

The opening at the upper portion of the processing chamber 1 is provided with a support, and a wafer holder 19 is placed and held on the support. The wafer holder 19 on the support may be of the mechanical type like this mechanism or may be of an electrostatic attraction type which electrically secures the wafer.

A hollow cylindrical discharge block 3 is gas-tightly mounted to the opening at the upper portion of the processing chamber 1 via a ring-like base flange 2. The discharge block 3 has an inner surface that is tapered to enlarge downward (in the drawing) at an angle of 10° to 30° with respect to the axial direction, and has, in this case, a plurality (20–50) of gas blowing ports 32 that are evenly formed along the circumference of the inner surface at an upper portion thereof (in the drawing). The inner surface of the discharge block 3 is tapered, so that the plasma is uniformly diffused to uniformly process the substrate that is to be processed. The angle of taper is preferably small, so that the mode of electric field does not change or other electric field modes does not increasingly enter while the microwaves travel through the discharge block 3. When the microwave electric field is of mode $TE_{11}$ or mode approximate thereto, the size of the tapered angle is desirably from 1.5 to 2.0 D in a position of the substrate to be processed, from 0.5 to 1.5 D in a position of the microwave introduction window, and the height therebetween is from 1.0 to 1.5 D, where D is the diameter of the substrate. The discharge block 3 is made of a non-magnetic electrically conductive material such as aluminum, non-magnetic stainless steel or the like. A protective member which is a plasma-resistant material is formed on the inner surface of the discharge block 3. The plasma-resistant material refers to the one that is little etched by the active species in a plasma. For instance, the material is alumina, mullite ($Al_2O_3+SiO_2$), quartz or the like. In this case, a protective film 31 is formed as the protective member. Further, a quartz sleeve 31A is inserted in the inner wall of the protective film 31. A heater 33 and a thermocouple (not shown) are mounted on the outer peripheral surface of the discharge block 3 in contact—with the surface, and the discharge block 3 is heated at a temperature of about 120° C. by a controller 34 that is connected to the heater 33 and to the thermocouple. In the opening at the upper portion of the discharge block 3 is gas-tightly mounted a disk-like microwave introduction window 4 made of a material which transmits microwaves such as quartz, alumina or the like, and a plasma-generating space is gas-tightly kept in the processing chamber 1 and in the discharge block 3 communicating with the chamber 1. Chamber 1 utilizes a chamber wall construction that includes application of a protective film or quartz in order to prevent the inside surface of the chamber wall being damaged by plasma ions and radicals.

A circular waveguide 5 is connected to the microwave introduction window 4. To the other end of the circular waveguide 5 are connected a rectangular-circular conversion waveguide 51 and a rectangular waveguide 52 in this order, and a microwave oscillator 6 is attached to the end of the rectangular waveguide 52. In the circular waveguide 5 is provided a tuning means for tuning microwaves to provide a fixed mode such as $TE_{11}$ mode under the resonant condition in the circular waveguide 5 having a resonation function. The tuning means also acts to select a desired mode to be transferred to the discharge chamber. Here, the tuning means referred to is a means that decreases the amount of reflection of the microwaves. In this case, the tuning means is a microwave tuning plate 53 of a ring-like disk and is mounted on an upper portion of the microwave introduction window 4. The tuning means is a plate having an opening through which the microwaves pass, and an optimum shape of the opening depends upon the mode of the microwave electric field transferred to the discharge chamber. In the case of mode $TE_{11}$ or a mode approximate thereto, a non-circular shape such as an oval shape or the like shape is preferable. If $TE_{01}$ mode is elected a circular shape may be effective. By employing an optimal shape of the microwave tuning plate that matches the mode of the microwaves, the electric field distribution (distribution within a plane in parallel with the surface to be processed) becomes uniform in the plasma where the microwaves are absorbed, and the sample can be uniformly processed.

A solenoid coil 91 and a solenoid coil 92 are arranged on the outer periphery of the circular waveguide 5 and the discharge block 3 and contained in a coil case 9. The solenoid coil 91 generates a magnetic field more intense than that of the solenoid coil 92, and their magnetic field intensities are controlled by a controller 93 connected to the solenoid coils 91 and 92. The coil case 9 is mounted on the circular waveguide 5 and on the discharge block 3, and the upper portion thereof above the discharge block 3 can be separated as one unit from the base flange 2. The upper portion above the discharge block 3 is attached or detached by a lift means that is not shown. A cooling gas feeding port 94 is formed at a lower portion of the coil case 9, a ventilation hole 54 is formed at a lower portion of the circular waveguide 5, and a cooling gas such as nitrogen gas or the air is fed into the coil case 9. The cooling gas fed into the coil case 5 flows through the ventilation hole 54 and is discharged to the open air through the waveguides 5, 51 and 52.

The base flange 2 is provided with a processing gas feeding port 21, and a gas feeding passage is formed leading to gas blowing ports 32 via a gas communication passage formed in a portion where the flange 2 is fitted to the discharge block 3 and a gas pipe formed in the discharge block 3. It is further possible, for example, to place a quartz plate having gas blowing ports under the microwave introduction window 4 made of a quartz plate, so as to introduce a processing gas into the space between the quartz plate and the microwave introduction window 4, and to blow the processing gas from the upper portion of the discharge block 3 (not shown). By this arrangement along with the tapered inner surface of the discharge block 3, the replacement of an old processing gas with a new processing gas in the discharge block 3 can be promoted. Accordingly, the reaction products are easily discharged out of the discharge block 3, and the etching rate and the uniformity are further enhanced. The gas communication passage formed in the portions where the base flange 2 is fitted to the discharge block 3 is established when they are combined together.

On the bottom portion of the processing chamber 1 is provided, via an insulating material 7, a sample stage 8 on which a wafer 10, a substrate to be processed, is placed concentrically with the axis of the discharge block 3 provided on the upper portion. To the sample stage 8 is connected an RF power source that is not shown so that a bias voltage can be applied thereto. At the central portion of the sample stage 8 is provided a wafer push-up 81 for sending and receiving a wafer 10 to and from a known conveyer means such as a robot arm that is not shown when the wafer 10 is placed on the sample plate 8 or is removed from the sample plate 8. A lift drive unit 82 is provided at the lower end of the wafer push-up 81 to move the wafer push-up 81 up and down. The lift drive unit 82 is firmly supported by a support member 83 that is attached to the lower portion of the sample plate 8. Moreover, a lift drive unit 84 is provided at the lower portion of the support member 83 to move the sample stage 8 up and down. The lift drive unit 84 is firmly supported by a support member 85 attached to the lower portion of the processing chamber 8. A spiral coolant passage 86 is formed in the sample stage 8 and is connected to a coolant feeding port 87 and to a coolant recovery port 88 that are formed in the support member 85 via piping.

In the thus constituted microwave plasma etching device, the sluice valves 18 are lowered by the lift drive units 19 in a state where the wafer is introduced into a load lock chamber (not shown) and is kept in a vacuum condition by known technology, and the wafer is introduced into the processing chamber 1 by a transfer arm (not shown). In this case, the sample stage 8 is lowered by the lift drive unit 84, and the wafer push-up 81, too, is lowered by the lift drive unit 82. When the transfer arm which has placed the wafer is halted at the upper part of the sample stage 8, the wafer push-up 81 is raised by the lift drive unit 82 to receive the wafer from the transfer arm. After the wafer is transferred onto the wafer push-up 81, the transfer arm returns back to its retracted position. The sluice valves 18 are then raised and a hermetically closed space is defined in the processing chamber 1. The interior of the processing chamber 1 is then evacuated by the evacuation means.

After the transfer arm has retracted, the wafer push-up 81 is lowered, and the wafer 10 is placed on the upper surface of the sample stage 8. Thereafter, the sample stage 8 is raised by the lift drive unit 84 to a predetermined position necessary for plasma processing. In this case, while the sample plate 8 is being raised, the upper peripheral surface of the wafer 10 that is being raised comes into contact with the wafer holder 19 that is placed on the support of the processing chamber 1, and the wafer holder 19 is lifted up. Thus, the wafer 10 is supported on the upper surface of the sample stage 8 by the own weight of the wafer holder 19 (or being pressed by a spring force). Here, the wafer 10 may be supported on the upper surface of the sample stage 8 by utilizing an electrostatic attracting force in place of using the wafer holder. A cooling medium such as cooling water is supplied from the coolant feeding port 87 to the coolant passage 86 in the sample stage 8, and the sample stage 8 is kept at a predetermined temperature. Different coolant can be selected depending upon the temperature of the sample stage to be cooled.

In evacuating the interior of the processing chamber 1 by the evacuation means prior to feeding the processing gas, when a predetermined pressure is detected by the pressure detector 17, the valve 16 is closed to isolate the pressure detector 17 from the atmosphere in the processing chamber 1. This makes it possible to protect the pressure detector 17 from the processing gas and the reaction products during the processing, and to accomplish correct detection at all times when necessary. Next, the processing gas is fed from the gas feeding port 21, the pressure in the processing chamber 1 is detected by a diaphragm vacuum gauge (not shown) while uniformly introducing the processing gas into the discharge block 3 through the plurality of gas blowing ports 32 that are evenly formed, and the pressure in the processing chamber 1 is controlled to acquire a predetermined value by the pressure control valve 12. In the discharge block 3, in this case, the processing gas is uniformly introduced from the upper portion of the discharge block 3 toward the center thereof, and is uniformly diffused in tapered space in the discharge block 3 before it is exhausted in a way from the upper side toward the lower side, making it possible to enhance homogeneity of the plasma that is produced.

When the pressure in the processing chamber 1 reached a predetermined value enough to execut the processing, microwaves are generated from the microwave oscillator 6 and are introduced into the discharge block 3 through the circular waveguide 5 and the microwave introduction window 4. Here, the impedance matching for the microwaves, introduced into the circular waveguide 5 through the rectangular waveguide 52 and the rectangular-circular conversion waveguide 51, is established by the space in the enlarged circular waveguide 5 and by the microwave tuning plate 53, whereby a uniform and strong electric field is created and is introduced into the discharge block 3 through the microwave introduction window 4. The discharge block 3 is heated by the heater 33 and is kept at a predetermined temperature by the controller 34 while detecting the temperature by the temperature detection means (thermocouple) that is not shown. The solenoid coils 91 and 92 are supplied with electric power from the controller 93 so that magnetic fields of predetermined intensities are generated, and magnetic fields are so generated as to form a planar ECR electron cyclotron resonance plane in the discharge block 3. Due to the introduction of microwaves into the discharge block 3 and formation of the magnetic field in the discharge block 3, the processing gas in the discharge block 3 turns into a plasma upon receiving the ECR action. The plasma is generated uniformly at a high density owing to the electric field from the circular waveguide 5 that is uniformly intensified by the action of the microwave tuning plate 53. The microwave tuning plate 53 has a shape that is best suited for the impedance matching of the microwaves in the circular waveguide 5, and the microwaves in the circular waveguide 5 are uniformed and efficiently introduced into the discharge block 3.

The wafer 10 is uniformly processed with a plasma which is generated in the discharge block 3 and has a uniform, high density. As a material to be processed, for instance, an aluminum alloy (Al—Si—Cu in this case) was processed by using an etching gas of $BCl_3+Cl_2+CH_2F_2$ (200 sccm at a flow rate ratio of about 6:7:1) under the conditions of a processing pressure of 0.012 Torr and a microwave power of 1000 W (2.45 GHz), the uniformity was about 4% when the microwave tuning plate 53 was used, which was about twice as good as the uniformity about 9% of when the microwave tuning plate 53 was not used. In this case, the uniformity of only the active species in the plasma was evaluated without applying an RF voltage to the sample plate 8.

In processing the wafer 10 with a plasma as described above, a position at which the ECR plane is formed by controlling the electric power supplied to the solenoid coils 91 and 92, is brought close to or away from the wafer 10 in order to change the amount of ions in the plasma incident upon the wafer 10 and to select low-damage processing, high-speed etching processing or selective etching.

Furthermore, a strong magnetic field is established by solenoid coils 91 and 92 to expand a resonance region with the microwave electric field in the form of a plane, the distance between the surface of the sample to be treated and the plane of the resonance region that are in parallel is changed when the sample is processed and when the sample is over-etched, and the position of the plasma that is generated by the actions of the electric field produced by the microwaves and by the magnetic field produced by the solenoid coils is changed. For example, the position of the plasma is moved away from the surface of the sample when it is to be processed to prevent the formation of residue at the time of etching the sample and the position of the plasma is moved close to the surface of the sample at the time of over-etching the sample, thereby to suppress the rate of etching of the underlying material at the time of over-etching the sample.

In processing the wafer 10 with a plasma as described above, $AlCl_3$ which is a reaction product tends to adhere to the inner wall of the discharge block 3 which is the plasma-generating chamber. By heating the discharge block 3 at about 120° C., however, the reaction products that tend to adhere to the wall surfaces in the discharge block 3 are heated and vaporized. That is, reaction products do not adhere to the inner wall surfaces of the discharge block 3 but are exhausted. Therefore, the processing with a plasma is free from change with time. During the processing with a plasma as described above, the discharge block 3 is heated at a temperature at which the reaction products vaporize.

A protective member such as of alumina, mullite or quartz and, in this case, a protective film 31 which is made of a plasma-resistant material, is formed on the inner wall surfaces of the discharge block 3 exposed to the plasma. Even when the discharge block 3 made of aluminum is similar to the material of an aluminum alloy to be processed, therefore, the discharge block 3 is protected from the plasma with which the material to be processed is etched.

After the etching of the wafer 10 that is executed as described above is finished, supply of the processing gas for etching, microwave power and RF power is stopped. The sample stage 8 is then lowered and the wafer is transferred out through the steps reverse to the steps of introducing the wafer. After the wafer is transferred out, the gas is replaced by a processing gas for cleaning. For instance, a gas for plasma-cleaning such as $O_2$ or $O_2+SF_6$ is introduced into the discharge block 3, and a plasma is generated in the same manner as when the etching is effected without placing a wafer 10 or dummy wafer on the sample stage 8 and without applying the RF voltage to the sample stage 8. After the plasma-cleaning is executed for about ten seconds, a new wafer is subjected to the etching in the same manner as described above. The plasma-cleaning without any wafer is most effective when it is executed after one wafer is processed. In practice, however, the controller that controls the processing apparatus is set to execute the plasma-cleaning of every two, three, or "n" wafers, etc., to meet the overall throughput, and the processing apparatus automatically executes the cleaning. Therefore, the cycle of plasma-cleaning that had, so far, been done for every lot every about 30 minutes by using a dummy wafer can be lengthened to four to 10 times or longer. Furthermore, the cycle of wet-cleaning in which the processing apparatus is opened to the air for a whole day every a week can be lengthened to two to three weeks or longer, contributing to greatly enhancing the throughput. Even the plasma-cleaning without a wafer can be executed without affecting the sample stage 8 since the processing time is short and a protective coating such as an Alumite coating is applied to the surface of the sample stage 8 on which the wafer is placed.

During the cleaning, furthermore, an inert gas such as $N_2$ or He that does not affect the process may be blown into the gap in which the wafer push-up 81 is provided from the lower side toward the upper side to blow dirt and dust staying in the gap in which the wafer push-up 81 is provided, in order to further enhance the cleaning effect.

The above-mentioned effects can similarly be obtained in regard to improvement of the throughput even when the solenoid coils 91, 92 and the controller 93 are omitted and even in the case of another processing apparatus using a plasma.

In opening the discharge block 3 to the air, furthermore, there is no need of disconnecting the gas piping and the like since the gas passage is formed between the discharge block 3 and the base flange 2. Moreover, the discharge block 3 and solenoid coils 91, 92 that are integrally constituted in the coil case 9 can be removed as one unit from the base flange 2, facilitating the cleaning operation, inspection and repairing work.

By employing a hot valve that can be heated between an auxiliary pump such as a rotary pump and a high-vacuum pump such as a turbo molecular pump 13 of the evacuation means, furthermore, it is possible to prevent the pressure from increasing on the exhaust side of the high-vacuum pump and, hence, to prevent the reactive products from adhering, which leads to an improved reliability of the evacuation means.

Figure 2:
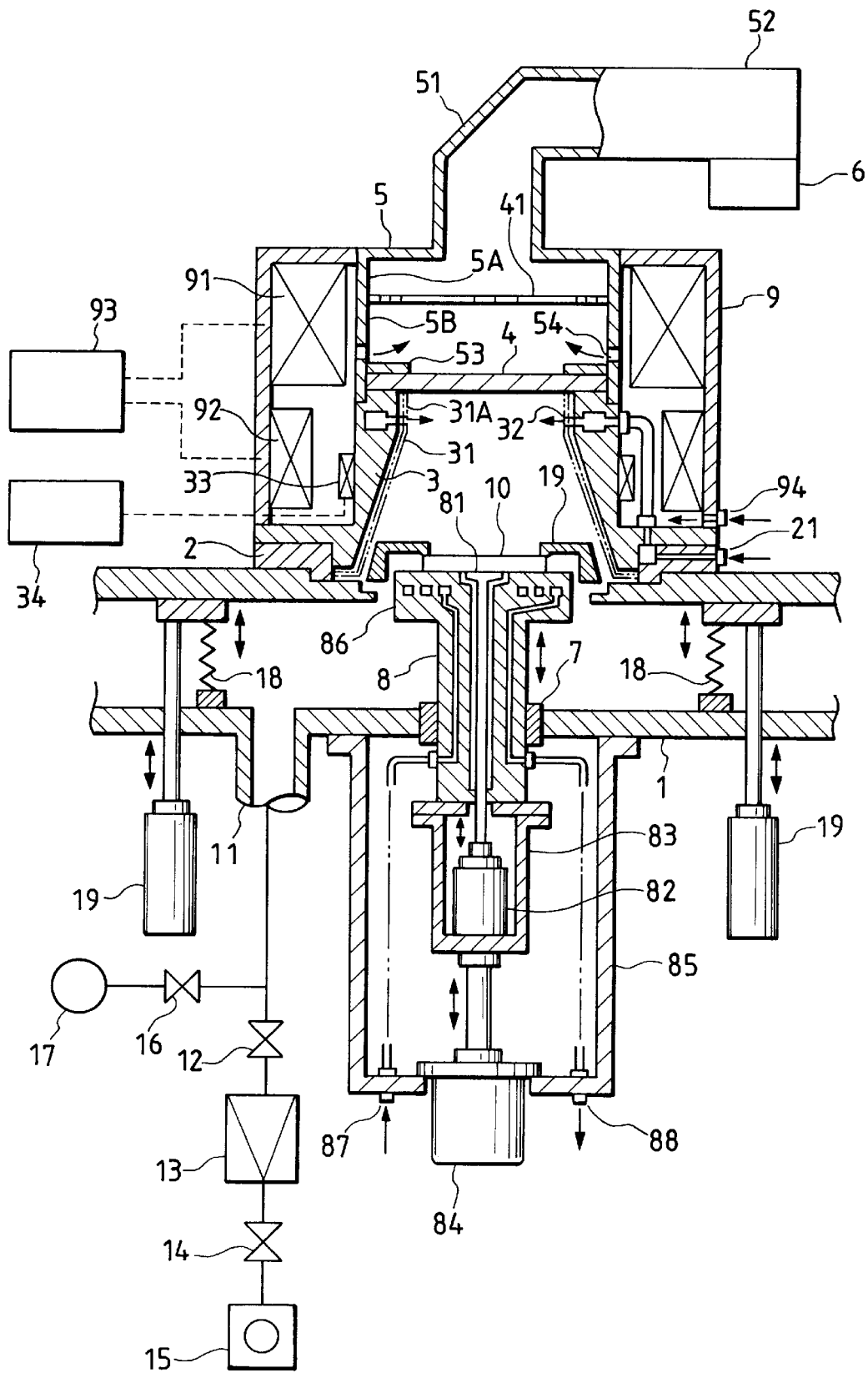
FIG. 2 is a vertical sectional view illustrating a microwave plasma processing apparatus of another embodiment of the present invention.

Another embodiment of the present invention will now be described with reference to FIGS. 2 and 3. In FIG. 2, the same portions as those of FIG. 1 are denoted by the same reference numerals and their description will be not repeated.

Figure 3:
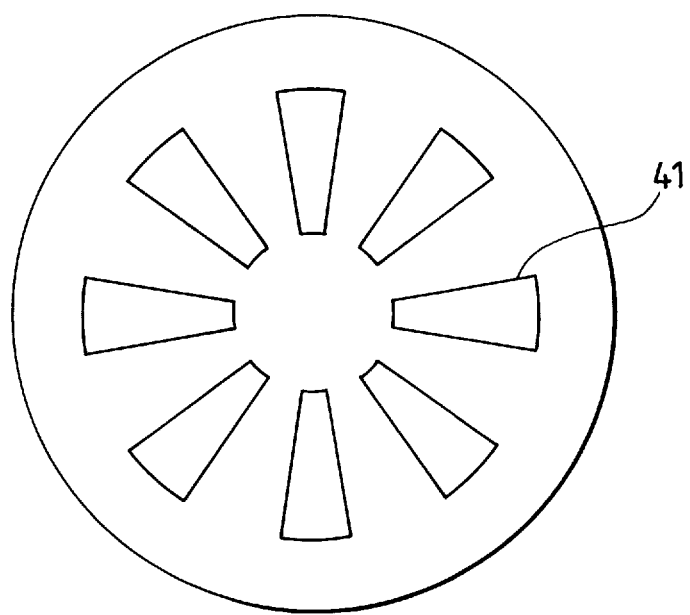
FIG. 3 is a plan view of a slot antenna of FIG. 2.

In this embodiment, a slot antenna 41 provided on the bottom surface of the waveguide 5A is radially arranged with respect to the center axis of the resonator as shown in FIG. 3 in order to emit a circular $TE_{01}$ mode. In this case, the microwaves emitted from a plurality of slot antennas 41 are propagated through a waveguide 5B having a predetermined distance and are then formed as a whole into microwaves of the circular $TE_{01}$ mode. A space is necessary between the slot antenna and the quartz window 4 through which the microwaves pass so that the microwaves emitted from the slot antenna can expand to a particular microwave mode, i.e., so that the microwaves emitted from the slot antenna 41 establish a particular microwave mode in the whole discharge tube 3A, i.e., in the plane. This space is formed by the waveguide 5B. The waveguide 5A and the slot antenna 41 are effective in stably forming microwaves of any mode, and a plasma is stably generated in the discharge tube 3A. By optimizing the distance between the quartz window 4 and the slot antenna 41, furthermore, there can be generated a uniform and highly dense plasma. Moreover, the waveguide 5A and the slot antenna 41 are so shaped as to emit microwaves of the circular $TE_{01}$ mode that is axially symmetrical, and the microwaves of the circular $TE_{01}$ mode are introduced into the discharge tube 3A to generate a uniform plasma.

By changing the shape of the slot antenna, furthermore, the microwaves of another mode can be introduced into the processing chamber. By changing the plasma density, it is allowed to feed a plasma that is best suited for the material that is to be processed.

As described above, the embodiment exhibits a variety of actions and effects, and the generation of a uniform and highly dense plasma helps further improve uniformity and processing ability in the processing of wafers with a plasma. Moreover, the processing with a plasma can be carried out maintaining a good performance independently of the material to be processed, and can be stably continued maintaining a state of good processing ability.

With respect to the above embodiment, the etching of an aluminum alloy was described as an example. However, the object to be etched is in no way limited thereto but may be a variety of materials such as metals, gates, oxides and the like. The invention can be adapted not only to the etching processing but also to other processings with a plasma such as film-forming processing and the like.

Concerning the uniformity, the same action as that of the above embodiment is obtained even in the case where the solenoid coils 91, 92 and the controller 93 in FIG. 1 are omitted, and uniformity in the processing can be improved.

The present invention makes it possible to produce a high-density uniform plasma, thereby to further improve the processing performance, to execute the processing with a plasma maintaining a good processing performance independently of the material to be processed, and to stably execute the processing with a plasma in a state in which good processing performance is maintained.

What is claimed is:

1. A plasma processing method wherein:

a first substrate to be processed is processed with a plasma in a processing chamber, in which the plasma is generated;

after said first substrate to be processed is processed with a plasma and is transferred from the processing chamber, the interior of said processing chamber is cleaned with a plasma without placing any further substrate to be processed on a sample stage in the processing chamber, whereby cleaning is performed without any substrate on the sample stage in the processing chamber, the sample stage including a member that protects the sample stage from damage due to the plasma during the cleaning, and wherein during the cleaning an inert gas is blown into a gap, at the sample stage, in which a wafer push-up is provided, to blow away contaminants in the gap;

a next substrate to be processed, after said first substrate, is introduced into said processing chamber after the cleaning with a plasma has been finished; and said next substrate to be processed is then processed.

2. A plasma processing method wherein:

a first substrate to be processed is processed with a plasma in a processing chamber in which a plasma is generated;

after said first substrate to be processed is processed with the plasma, said first substrate is transferred from the processing chamber, and thereafter the interior of said processing chamber is cleaned with a plasma without placing any further substrate to be processed on a sample stage in the processing chamber, so as to perform plasma cleaning, whereby the cleaning is performed without any substrate on the sample stage in the processing chamber, wherein said sample stage is cleaned during the plasma cleaning within the processing chamber, and wherein during the cleaning an inert gas is blown into a gap, at the sample stage, in which a wafer push-up is provided, to blow away contaminants in the gap;

then a next substrate to be processed, after said first substrate, is introduced into said processing chamber, after the cleaning has been finished; and said next substrate to be processed is then processed.

* * * * *